United States Patent
Lin et al.

(10) Patent No.: US 10,580,696 B1
(45) Date of Patent: Mar. 3, 2020

(54) INTERCONNECTS FORMED BY A METAL DISPLACEMENT REACTION

(71) Applicant: GLOBALFOUNDRIES Inc., Grand Cayman (KY)

(72) Inventors: Sean Xuan Lin, Watervliet, NY (US); Christian Witt, Woodbridge, CT (US); Mark V. Raymond, Latham, NY (US); Nicholas V. LiCausi, Watervliet, NY (US); Errol Todd Ryan, Clifton Park, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 16/106,246

(22) Filed: Aug. 21, 2018

(51) Int. Cl.
| | |
|---|---|
| *H01L 23/12* | (2006.01) |
| *H01L 23/52* | (2006.01) |
| *H01L 29/40* | (2006.01) |
| *H01L 21/768* | (2006.01) |
| *H01L 23/532* | (2006.01) |
| *H01L 21/288* | (2006.01) |

(52) U.S. Cl.
CPC .. *H01L 21/76883* (2013.01); *H01L 21/76843* (2013.01); *H01L 21/76879* (2013.01); *H01L 21/76886* (2013.01); *H01L 23/53238* (2013.01); *H01L 23/53257* (2013.01); *H01L 21/288* (2013.01)

(58) Field of Classification Search
CPC .............. H01L 28/65; H01L 23/53252; H01L 2224/05676; H01L 28/75; H01L 2924/01044; H01L 21/76846; H01L 2224/05176

USPC .......................................... 257/758; 438/622
See application file for complete search history.

(56) References Cited

U.S. PATENT DOCUMENTS

| | | | |
|---|---|---|---|
| 6,274,424 B1* | 8/2001 | White, Jr. ......... | H01L 27/10852 257/E21.009 |
| 7,476,618 B2 | 1/2009 | Kilpela et al. | |
| 8,232,195 B2* | 7/2012 | Yang ................ | H01L 21/76865 257/758 |
| 8,749,064 B2* | 6/2014 | Maekawa ......... | H01L 21/76805 257/750 |
| 2004/0108217 A1 | 6/2004 | Dubin | |
| 2006/0125100 A1* | 6/2006 | Arakawa ........... | H01L 21/76805 257/758 |
| 2007/0085211 A1* | 4/2007 | Hamada ............. | H01L 21/2855 257/758 |

(Continued)

OTHER PUBLICATIONS

Zheng et al., "Platinum—Ruthenium Nanotubes and Platinum—Ruthenium Coated Copper Nanowires As Efficient Catalysts for Electro-Oxidation of Methanol", ACS Catalysis 2015 5 (3), 1468-1474, Abstract only.

(Continued)

*Primary Examiner* — S. V. Clark
(74) *Attorney, Agent, or Firm* — Thompson Hine LLP; Anthony Canale (57) ABSTRACT

Structures for interconnects and methods of forming interconnects. An interconnect opening in a dielectric layer includes a first portion and a second portion arranged over the first portion. A first conductor layer composed of a first metal is arranged inside the first portion of the interconnect opening. A second conductor layer composed of a second metal is arranged inside the second portion of the interconnect opening. The first metal is ruthenium.

20 Claims, 5 Drawing Sheets

(56) References Cited

U.S. PATENT DOCUMENTS

2007/0164438 A1* 7/2007 Sir ................... H01L 21/486
  257/758
2009/0127711 A1* 5/2009 Bonilla ............ H01L 21/76805
  257/758

OTHER PUBLICATIONS

ASM International, "Electroless deposition of cobalt enables void-free filling of vias for electronic chips", May 26, 2015, retrieved from the internet at https://www.asminternational.org/web/hts/news/newswire/-/journal_content/56/10180/25458976/NEWS;jsessionid=76C19A3704734FB398D906A943FD9672?p_p_id=webcontentresults_WAR_webcontentsearchportlet_INSTANCE_Dp9EatmyGsZu&p_p_lifecycle=0&p_p_state=normal&p_p_mode=view&p_p_col_id=column-2&p_p_col_pos=2&p_p_col_count=3.

Zsolt Tokei, "Sub-5nm Interconnect Trends and Opportunities", 63rd Annual IEEE International Electron Devices Meeting (IEDM), Dec. 2-6, 2017.

Sean Xuan Lin et al., "Interconnects Formed by a Metal Replacement Process", U.S. Appl. No. 15/705,956, filed Sep. 15, 2017.

* cited by examiner

FIG. 10 though the US 10,580,696 B1

INTERCONNECTS FORMED BY A METAL DISPLACEMENT REACTION

BACKGROUND

The present invention relates to integrated circuits and semiconductor device fabrication and, more specifically, to structures for interconnects and methods of forming interconnects.

An interconnect structure may be used to electrically connect device structures fabricated by front-end-of-line (FEOL) processing. A back-end-of-line (BEOL) portion of the interconnect structure may include metallization formed using a damascene process in which via openings and trenches are etched as interconnect openings in an interlayer dielectric layer and filled with metal to create interconnects in one or more metallization levels.

Copper is a common material used in the metallization of the BEOL portion of the interconnect structure. A barrier/liner layer is required for copper metallization in order to control unwanted diffusion of copper atoms to nearby dielectric materials, such as the interlayer dielectric layer. As the dimensions of interconnects shrink, the resistance of copper interconnects may become unacceptable due to the fraction of the volume of the interconnect opening that is occupied by the barrier/liner layer.

Improved structures for interconnects and methods of forming interconnects are needed.

SUMMARY

According to an embodiment of the invention, a structure includes a dielectric layer having an interconnect opening with a first portion and a second portion arranged over the first portion. A first conductor layer composed of a first metal is arranged inside the first portion of the interconnect opening. A second conductor layer composed of a second metal is arranged inside the second portion of the interconnect opening. The first metal is ruthenium.

According to an embodiment of the invention, a method includes forming an interconnect opening in a dielectric layer, and forming a first conductor layer comprised of a first metal in the interconnect opening. The method further includes forming a second conductor layer inside the interconnect opening by displacing the first metal of the first conductor layer and replacing the first metal with a second metal different from the first metal in a displacement reaction. The second metal is ruthenium.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
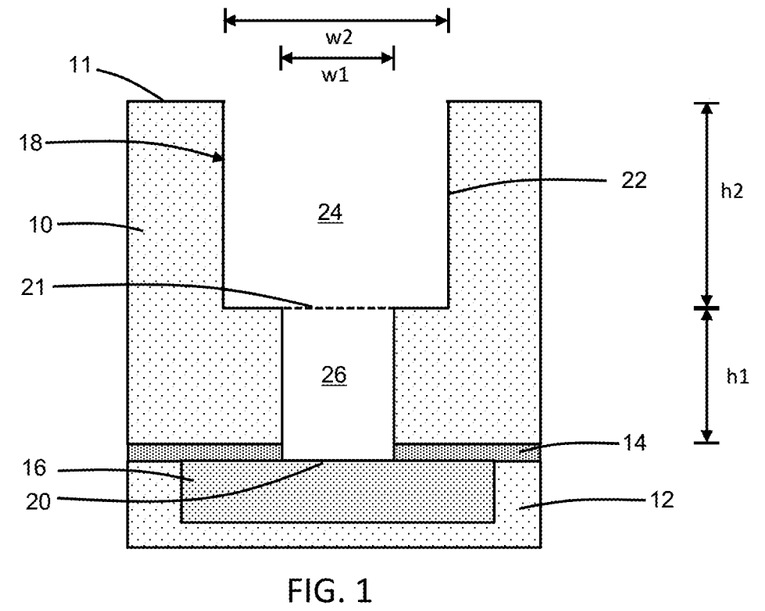
FIGS. 1-4 are cross-sectional views of a structure at successive fabrication stages of a processing method in accordance with embodiments of the invention.

With reference to FIG. 1 and in accordance with embodiments of the invention, a dielectric layer 10 may be used in forming a metallization level of a back-end-of-line or middle-of-line interconnect structure. The back-end-of-line or middle-of-line interconnect structure is carried on a substrate or wafer that has been processed by front-end-of-line processes, such as complementary-metal-oxide-semiconductor (CMOS) processes, to form device structures. The dielectric layer 10 is arranged over a dielectric layer 12, and a cap layer 14 is arranged between the dielectric layer 10 and the dielectric layer 12. The dielectric layers 10, 12 may be composed of an electrical insulator, such as a low-k or ultra-low-k dielectric material, that is deposited by chemical vapor deposition or another deposition technique. The cap layer 14 may be composed of a dielectric material, such as silicon nitride ($Si_3N_4$), that is deposited by chemical vapor deposition or another deposition technique. The dielectric layer 12 may be included in a lower metallization level that underlies the metallization level to be formed using the dielectric layer 10. A metal feature 16 is arranged in the dielectric layer 12. The metal feature 16 may be composed of copper (Cu) or cobalt (Co) and may be formed by a damascene process. In an embodiment, the lower metallization level may be the lowest metallization level that is closest to the device structures.

An interconnect opening 18, which may be formed by a lithography and etching process, extends through the dielectric layer 10 and cap layer 14 to the metal feature 16. To that end, a photoresist layer may be applied over the dielectric layer 10, exposed to a pattern of radiation projected through a photomask, and developed to form an opening situated at the intended location for the interconnect opening 18. The patterned photoresist layer is used as an etch mask for an etching process, such as a reactive-ion etching (RIE) process, that removes unmasked portions of the dielectric layer 10 to define the interconnect opening 18. The etching process may be conducted in a single etching step or multiple etching steps and with the use of multiple photoresist layers.

The interconnect opening 18 includes one or more sidewalls 22 that penetrate from a top surface 11 of the dielectric layer 10 through the dielectric layer 10 and open onto a surface of the metal feature 16 at a bottom end 20 of the interconnect opening 18. The sidewalls 22 are bounded by the surfaces of the dielectric material of the dielectric layer 10. The metal feature 16 forms a lower boundary in a vertical direction for the interconnect opening 18 at the bottom end 20 of the interconnect opening 18. In the representative embodiment, the interconnect opening 18 is a dual-damascene opening that includes a via opening 26 opening on the metal feature 16 and a trench 24 that is arranged over the via opening 26. The via opening 26 has a width, w1, and a height, h1, extending between the bottom end 20 of the interconnect opening 18 and a top end 21 at the intersection of the via opening 26 with the trench 24. The trench 24 has a height, h2, extending from the top end 21 of the via opening 26 to the top surface 11 of the dielectric layer 10, as well as a width, w2, that is greater than the width, w1, of the via opening 26. The sidewalls 22 of the interconnect opening 18 may be vertical to provide constant widths for the trench 24 and via opening 26 over their respective heights, or may have a degree of tapering over their respective heights.

Figure 2:
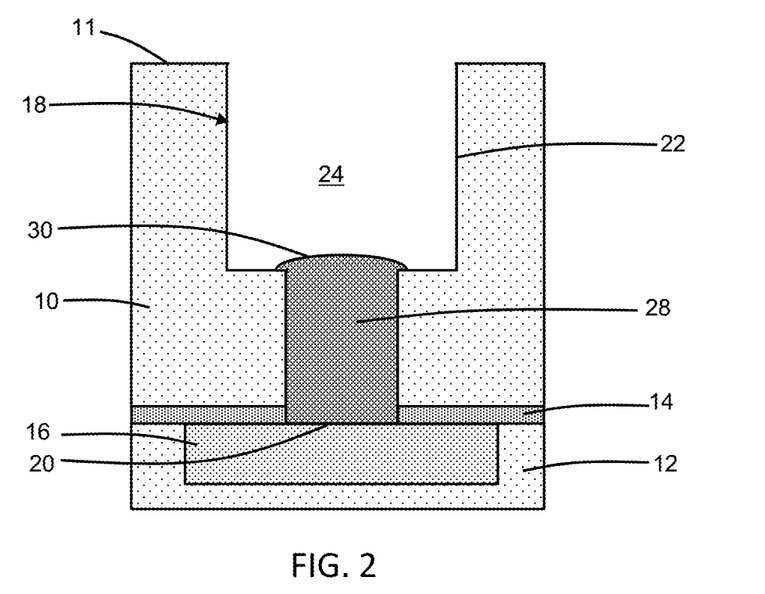

With reference to FIG. 2 in which like reference numerals refer to like features in FIG. 1 and at a subsequent fabrication stage, a conductor layer 28 is formed inside a lower portion of the interconnect opening 18. In the representative embodiment, the conductor layer 28 is formed inside the via opening 26 of the interconnect opening 18, and includes a top surface 30 that projects out of the top end 21 of the via opening 26 as a result of overfilling the via opening 26 such that the thickness of the conductor layer 28 is greater than the height, h1, of the via opening 26. The conductor layer 28 also includes a bottom surface that is coextensive with the bottom end 20 of the interconnect opening 18 and that is arranged in a contacting relationship with the metal feature 16.

In an embodiment, the top surface 30 of the portion of the conductor layer 28 that projects out of the top end 21 of the via opening 26 has a dome shape. In an embodiment, the dome shape of the top surface 30 is arcuate and convex with a curvature that curves outward from the top end 21 of the via opening 26. The top surface 30 of the conductor layer 28 may extend laterally to slightly overlap with a horizontal surface of the dielectric layer 10 at the bottom of the trench 24 adjacent to the top end 21 of the via opening 26. The trench 24 of the interconnect opening 18 is unfilled by the conductor layer 28, other than the protruding top surface 30 projecting out of the via opening 26 and into the space inside the trench 24.

The conductor layer 28 may be composed of a metal that is formed by a selective deposition process in which its material nucleates for growth on the metal feature 16 and grows upward in a vertical direction from the metal feature 16 at the bottom end 20 of the interconnect opening 18. In an embodiment, the conductor layer 28 may be composed of copper (Cu) or cobalt (Co) that is deposited by a wet deposition process or dry deposition process. An exemplary wet deposition process is electroless deposition. Consistent with a selective deposition process, lateral growth from the dielectric material of the dielectric layer 10 bordering the sidewalls 22 of interconnect opening 18 over the height of the via opening 26 is absent. Due to the preferentially-upward growth from the metal feature 16, the conductor layer 28 may lack defects, such as voids and inclusions, that may be introduced by non-selective deposition processes. The growth may be controlled to halt the selective deposition process after the top surface 30 is formed.

Figure 3:
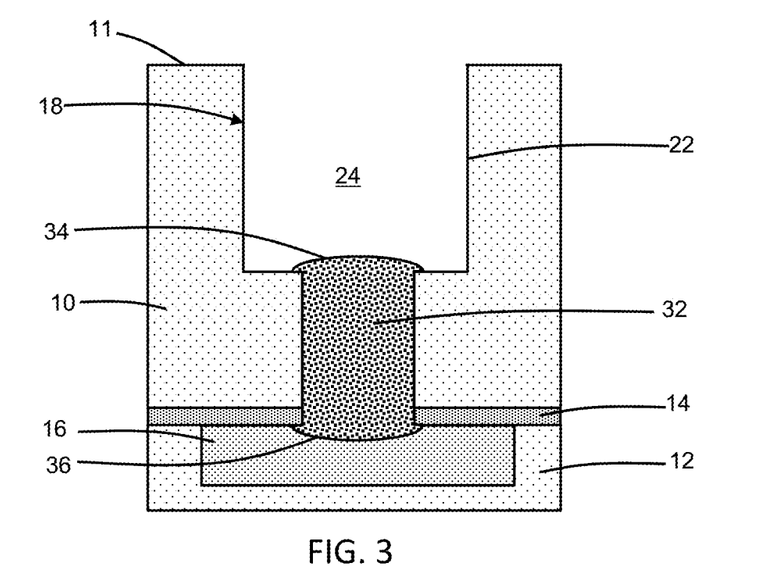

With reference to FIG. 3 in which like reference numerals refer to like features in FIG. 2 and at a subsequent fabrication stage, a conductor layer 32 is formed inside the lower portion of the interconnect opening 18 by displacing atoms of the metal constituting the conductor layer 28 (FIG. 2) and replacing these displaced metal atoms with atoms of a different metal in a displacement reaction, also referred to herein as a replacement reaction. The displacement reaction may proceed spontaneously due to kinetics of the associated oxidation-reduction chemical reaction providing the atomic replacement. The displacement reaction is distinguishable from electroless deposition processes that are additive and that do not rely on the mechanism of atomic replacement. In the performance of the displacement reaction, atoms of the metal in the conductor layer 28 are replaced by atoms of a metal having a higher standard reduction potential. The displacement reaction is selective in that deposition of the metal of the conductor layer 32 does not initiate on the surfaces of the dielectric layer 10 that border the trench 24 of the interconnect opening 18 or on the top surface 11 of the dielectric layer 10, as would occur with other types of deposition techniques, such as atomic layer deposition (ALD), chemical vapor deposition (CVD), or physical vapor deposition (PVD).

In an embodiment, the conductor layer 32 may contain ruthenium (Ru) metal after the displacement reaction is completed. Before the reaction, ruthenium may be formulated in a form of ruthenium salt or other ruthenium compound that is dissolved in a solvent to form a bath or solution. An example of a ruthenium compound is a ruthenium salt, such as ruthenium chloride, that provides $Ru^{3+}$ ions when dissolved. Another example of a ruthenium compound is ruthenium nitrosyl nitrate that also provides $Ru^{3+}$ ions when dissolved. The solution may further contain additional agents, such as hypophosphite, borohydride, dimethyl borane, and/or hydrazine that promote the displacement reaction, as well as stabilizers, inhibitors, and/or wetting agents.

When the substrate is placed in the solution and immersed to expose the conductor layer 28 to the solution, ruthenium ions in the solution react with copper or cobalt atoms in the conductor layer 28. More specifically, ruthenium ions in the solution oxidize copper or cobalt atoms and reduce themselves to ruthenium metal due to differences in electrochemical properties between ruthenium and either copper or cobalt. For example, ruthenium has a standard reduction potential that is greater than either the standard reduction potential of copper or the standard reduction potential of cobalt. The spontaneous oxidation-reduction reaction that occurs during a displacement reaction replacing copper with ruthenium is given by $2Ru^{3+}+3Cu(s) \rightarrow 2Ru(s)+3Cu^{2+}$. The spontaneous oxidation-reduction reaction that occurs during a displacement reaction replacing cobalt with ruthenium is given by $2Ru^{3+}+3Co(s) \rightarrow 2Ru(s)+3Co^{2+}$.

The replacement reaction, which is not self-limiting, initiates at the top surface 30 of the conductor layer 28 and proceeds downward in a vertical direction toward the metal feature 16. The displacement reaction is not a self-limiting reaction in that the displacement reaction does not stop when the top surface of conductor layer 28 in the via opening 26 is fully covered with ruthenium. Instead, the displacement reaction continues downward through at least the thickness of the conductor layer 28 until the reaction is halted by removing the substrate from the solution.

In an embodiment, the conductor layer 32 may displace and replace the conductor layer 28 such that the lower portion of the interconnect opening 18 is filled by the conductor layer 32. In an embodiment, the via opening 26 of the interconnect opening 18 is substantially filled between the bottom and top ends 20, 21 (FIG. 1) by the conductor layer 32, which defines a back-end-of-line or middle-of-line interconnect in the form of, for example, a via plug or contact. In an embodiment, the conductor layer 32 completely fills the via opening 26 of the interconnect opening 18 between the bottom and top ends 20, 21. The conductor layer 32 has a directly contacting relationship with the sidewalls 22 of the interconnect opening 18 and, in particular, may be in direct contact with the portion of the sidewalls 22 of the interconnect opening 18 that are associated with the via opening 26.

The conductor layer 32 has dimensions above the bottom end 20 of the interconnect opening 18 that may be equal to the dimensions of the replaced conductor layer 28, and the conductor layer 32 may have the same shape above the bottom end 20 of the interconnect opening 18 as the replaced conductor layer 28, as a result of the conductor layer 28 being completely replaced by the conductor layer 32. In the representative embodiment, a portion of the conductor layer 32 projects out of the top end 21 of the via opening 26, and this projecting portion of the conductor layer 32 has a top surface 34 that may adopt the shape of the top surface 30 of the replaced conductor layer 28. In an embodiment, the top surface 34 of conductor layer 32 has a dome shape that matches the adopted dome shape of the top surface 30 of the conductor layer 28. In an embodiment, the dome shape of the top surface 34 is arcuate and convex with a curvature that curves outward from the top end 21 of the via opening 26. The top surface 34 of the conductor layer 32 may extend laterally to slightly overlap with a horizontal surface of the dielectric layer 10 at the bottom of the trench 24 adjacent to the top end 21 of the via opening 26.

In an embodiment, the displacement reaction forming the conductor layer 32 may also modify a portion of the conductor contained in the metal feature 16, which may also be composed of copper or cobalt and susceptible to modification by the displacement reaction. To that end, after the conductor layer 28 is reacted and consumed to reach the metal feature 16, the displacement reaction may be extended with a timed process to displace and replace a portion of the metal forming the metal feature 16 adjacent to the bottom end 20 of the interconnect opening 18. The replaced portion may provide the conductor layer 32 with a bottom surface 36 that projects out of the bottom end 20 of the via opening 26. In an embodiment, the bottom surface 36 of the conductor layer 32 may have a dome shape, which may be related to the isotropic growth characteristic of the displacement reaction. In an embodiment, the dome shape of the bottom surface 36 is arcuate and convex with a curvature that curves outward from the bottom end 20 of the via opening 26.

The bottom surface 36 defines a curved interface between the conductor layer 32 and the metal feature 16 at which the identity of the metal changes from the metal of the conductor layer 32 to the unmodified original metal of the metal feature 16. The result is that both the opposite top and bottom surfaces 34, 36 of the conductor layer 32 may each have a dome shape, which may be arcuate and convex, for the portions of the conductor layer 32 that effectively project out of both of the ends 20, 21 of the via opening 26.

A barrier/liner layer is absent between the conductor layer 32 and the dielectric material of the dielectric layer 10 bordering the interconnect opening 18. In particular, the conductor layer 32 is in direct contact with the dielectric layer 10 bordering the interconnect opening 18 at the sidewalls 22 and, in particular, the dielectric layer 10 bordering the interconnect opening 18 at the sidewalls 22 over the height of the via opening 26.

Figure 4:
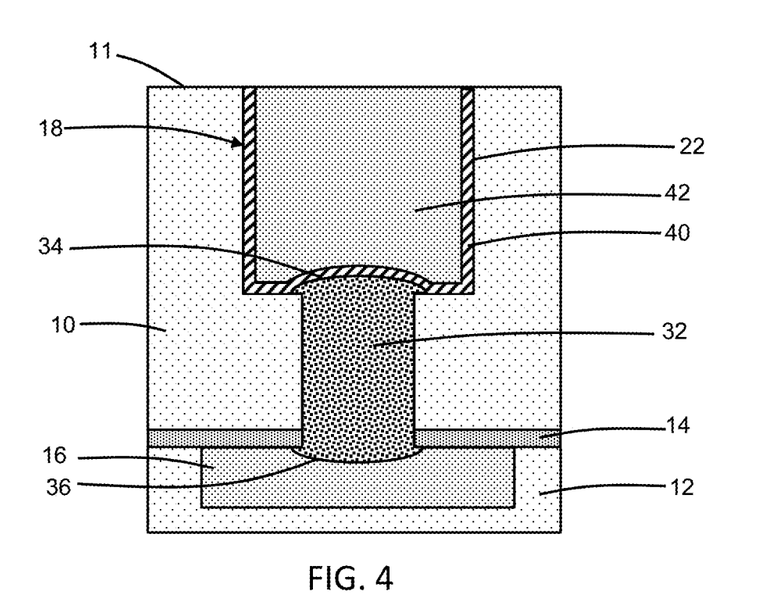

With reference to FIG. 4 in which like reference numerals refer to like features in FIG. 3 and at a subsequent fabrication stage, a barrier/liner layer 40 of a given thickness may be formed inside the interconnect opening 18 over the conductor layer 32. The barrier/liner layer 40 may be formed inside the trench 24 on the sidewalls 22 of the dielectric layer 10 bordering the trench 24 and over the top surface 34 of the conductor layer 32. The barrier/liner layer 40 may be composed of titanium (Ti), titanium nitride (TiN), tantalum (Ta), tantalum nitride (TaN), ruthenium (Ru), cobalt (Co) or a multilayer combination of these materials (e.g., a TaN/Co bilayer, or Ta/TaN/Ru trilayer) deposited by physical vapor deposition, chemical vapor deposition, or atomic layer deposition. An optional seed layer (not shown) may be formed on the barrier/liner layer 40, and may be composed of copper (Cu), cobalt (Co), ruthenium (Ru), or an alloy thereof. The barrier/liner layer 40 and the optional seed layer conform to the shapes of the interconnect opening 18 and the conductor layer 32 such that the surfaces of the dielectric layer 10 bordering the sidewalls 22 of the trench 24 of the interconnect opening 18 and the top surface 34 of the conductor layer 32 are completely covered by a uniform given thickness.

A conductor layer 42 is formed inside the portion of the interconnect opening 18 that is unfilled by the barrier/liner layer 40 and optional seed layer. In an embodiment, the conductor layer 42 is formed in the portion of the trench 24 of the interconnect opening 18 that is unfilled by the barrier/liner layer 40 and optional seed layer. The conductor layer 42 may be deposited by electroless deposition, and formation of the material of the conductor layer 42 may be promoted by the seed layer deposited over the barrier/liner layer 40. Alternatively, the conductor layer 42 may be formed by a physical vapor deposition or chemical vapor deposition process, followed by an optional reflow process. The conductor layer 42 may be composed of a metal, such as copper (Cu) or cobalt (Co). The materials of the barrier/liner layer 40, the optional seed layer, and the conductor layer 42 may also form on the field area on the top surface 11 of the dielectric layer 10 and may be removed with a chemical mechanical polishing (CMP) process. The top surface 34 of the conductor layer 32 defines a curved interface at which the identity of the metal changes from the metal of the conductor layer 32 to the metal of the barrier/liner layer 40 and conductor layer 42.

The conductor layer 32 containing ruthenium may have larger dimensions (e.g., a larger diameter or width) than a comparable copper or cobalt layer because of the absence of the need for a barrier/liner layer between the dielectric layer 10 bordering the sidewalls 22 of the interconnect opening 18 and the conductor layer 32. The elimination of the barrier/liner layer is permitted because ruthenium tends to diffuse less into low-k dielectric materials than either copper or cobalt. The materials forming a barrier/liner layer, such as titanium nitride (TaN), also have a higher electrical resistivity than a metallic conductor like ruthenium.

The dome shape of the top and bottom surfaces 34, 36 at the opposite ends of the conductor layer 32 increases the available contact areas. The dome shape of the bottom surface 36 of the conductor layer 32 in the lower portion of the interconnect opening 18 (e.g., the via opening 26) may provide a lower electrical resistance in a vertical direction than a comparable copper or cobalt layer because, at least in part, of the absence of the barrier/liner layer and the area increase provided by the dome shape. The conductor layer 42 in the upper portion of the interconnect opening 18 (e.g., the trench 24) may exhibit a lower electrical resistance in vertical direction than in the absence of the dome-shaped top surface 34 (e.g., a flat top surface).

Ruthenium also exhibits a higher resistance to electromigration than copper or cobalt. The barrier/liner layer 40 surrounding the conductor layer 32 may also be scaled thinner, than as is conventional, because ruthenium provides an electromigration blocking boundary to eliminate or reduce the migration of metal atoms from the conductor layer 42 in the upper portion of the interconnect opening 18 through the conductor layer 32.

The displacement reaction also provides a formation technique for filling the lower portion of the interconnect opening 18 with a conductor (i.e., ruthenium) that overcomes difficulties that may be experienced with other types of metal filling techniques like electrodeposition, electroless deposition, physical vapor deposition, or chemical vapor deposition processes. The conductor layer 32 formed by the displacement reaction may be utilized in either a middle-of-line (MOL) portion or a back-end-of-line (BEOL) portion of an interconnect structure.

Figure 5:
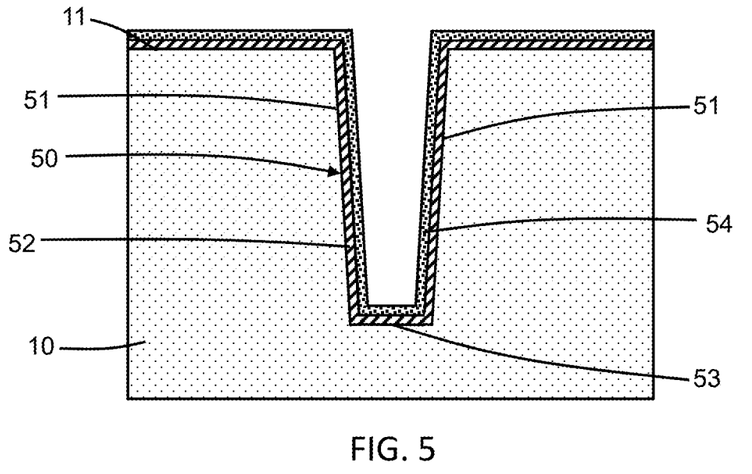
FIGS. 5-8 are cross-sectional views of a structure at successive fabrication stages of a processing method in accordance with alternative embodiments of the invention.

With reference to FIG. 5 in which like reference numerals refer to like features in FIG. 1 and in accordance with embodiments of the invention, an interconnect opening 50 may be formed by lithography and etching in the dielectric layer 10. The interconnect opening 50 may constitute a contact opening, a via opening, a trench, or a combination thereof that is defined in the dielectric layer 10. The interconnect opening 50 may have inclined sidewalls that provide a trapezoidal shape, or may have sidewalls that provide a different shape.

A barrier layer 52 and a liner layer 54 are arranged on the surfaces of the dielectric material of the dielectric layer 10 at the sidewalls 51 and at the bottom end 53 of the interconnect opening 50. The barrier layer 52 is arranged between the liner layer 54 and the dielectric material of the dielectric layer 10. The barrier layer 52, which is deposited before the liner layer 54, may be composed of, for example, tantalum nitride (TaN), tantalum (Ta), tantalum nitride (TaN), titanium nitride (TiN), etc. deposited by physical vapor deposition, chemical vapor deposition, or atomic layer deposition. The liner layer 54, which is deposited on the barrier layer 52, may be comprised of ruthenium (Ru) deposited by, for example, physical vapor deposition, chemical vapor deposition, or atomic layer deposition. The barrier layer 52 and liner layer 54 each conform to the shape of the interconnect opening 50 when deposited, and each of the layers 52, 54 may have a uniform thickness. The materials of the barrier layer 52 and liner layer 54 also deposit in the field area on the top surface 11 of the dielectric layer 10.

Figure 6:
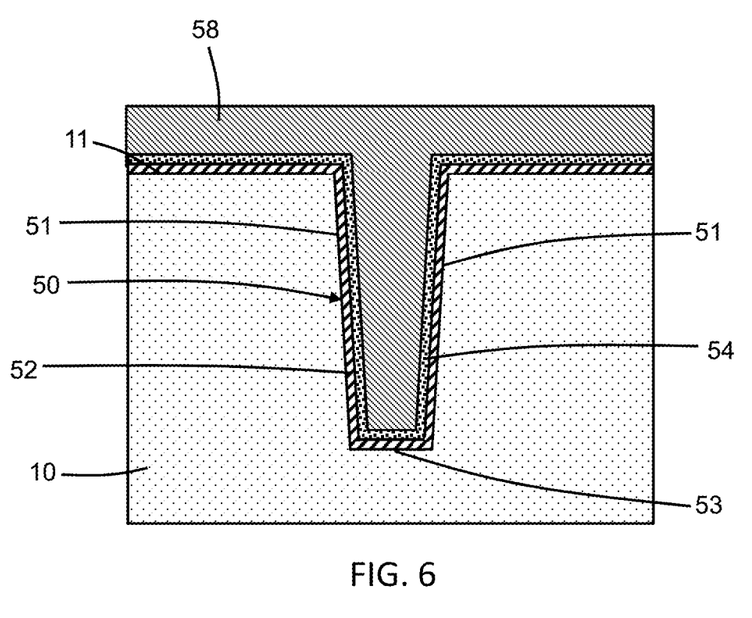

With reference to FIG. 6 in which like reference numerals refer to like features in FIG. 5 and at a subsequent fabrication stage, a conductor layer 58 is formed inside the interconnect opening 50 in contact with the liner layer 54. The conductor layer 58 may be composed of a metal, such as copper (Cu) or cobalt (Co), formed by electroless or electrolytic deposition, or by physical vapor deposition or chemical vapor deposition with an optional reflow process. The metal of the conductor layer 58 also forms in the field area on the top surface 11 of the dielectric layer 10. Following deposition, the conductor layer 58 may be annealed to increase a density of its metal and/or to reduce any included voids that may form in its metal during deposition. In an embodiment, the anneal may be a thermal anneal that is conducted at a temperature ranging from 100° C. to 500° C. in an atmosphere of hydrogen, nitrogen, or a mixture of these gases.

Figure 7:
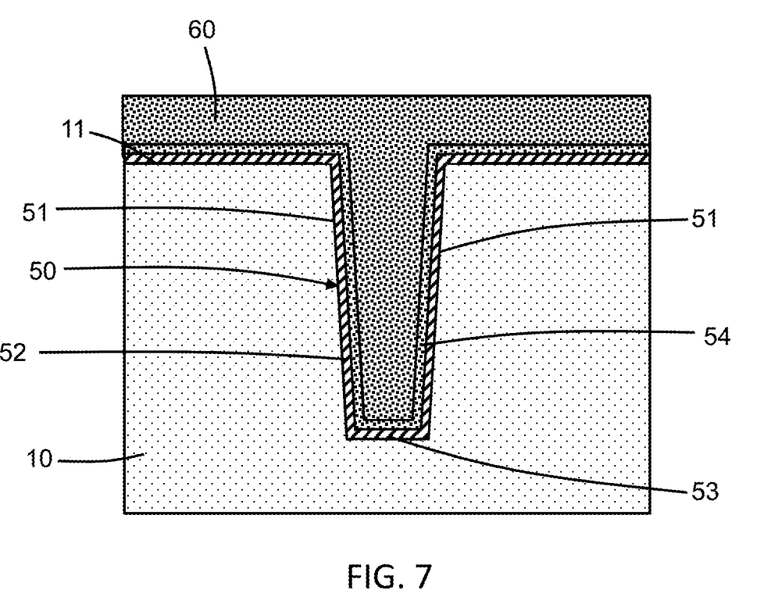

With reference to FIG. 7 in which like reference numerals refer to like features in FIG. 6 and at a subsequent fabrication stage, a conductor layer 60 is formed by displacing atoms of the metal (e.g., cobalt or copper) constituting the conductor layer 58 and replacing these displaced metal atoms with atoms of a different metal (e.g., ruthenium) in a displacement reaction, as described above in the contest of the displacement reaction replacing the conductor layer 28 (FIG. 2) with the conductor layer 32 (FIG. 3). The use of the displacement reaction to form the conductor layer 60 avoids pinch-off that may occur during conventional ruthenium deposition processes, such as electrodeposition, physical vapor deposition, atomic layer deposition, and chemical vapor deposition. Pinch-off may produce included voids in the deposited metal inside the interconnect opening 50. The use of the displacement reaction produces void-free ruthenium in the interconnect opening 50 because the interconnect opening 50 is initially filled with void-free copper or cobalt using a different deposition process, such as bottom-up electroplating or thermal reflow technology.

In an alternative embodiment, the conductor layer 58 may be planarized and removed from the field area on the top surface 11 of the dielectric layer 10 with a chemical mechanical polishing (CMP) process before performing the displacement reaction.

Figure 8:
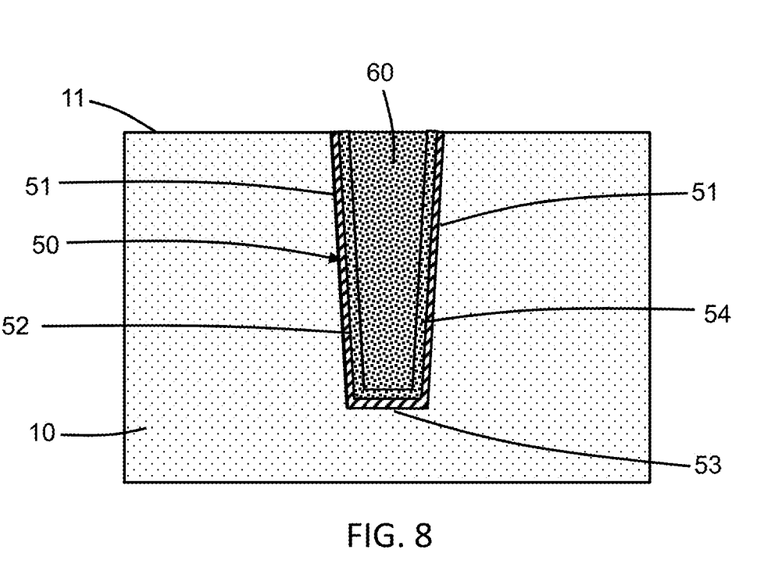

With reference to FIG. 8 in which like reference numerals refer to like features in FIG. 7 and at a subsequent fabrication stage, the conductor layer 60 may be planarized with a chemical mechanical polishing (CMP) process, which leaves the conductor layer 60 inside the interconnect opening 50. The conductor layer 60 provides an interconnect that may constitute a contact, a via, or a wire. The barrier layer 52 and liner layer 54 may also be removed from the field area on the top surface 11 of the dielectric layer 10 by the chemical mechanical polishing process. The conductor layer 60 may be annealed either before or after planarization by the chemical mechanical polishing process. In an embodiment, the anneal may be a thermal anneal that is conducted at a temperature ranging from 100° C. to 500° C. in an atmosphere of hydrogen, nitrogen, or a mixture of these gases.

Figure 9:
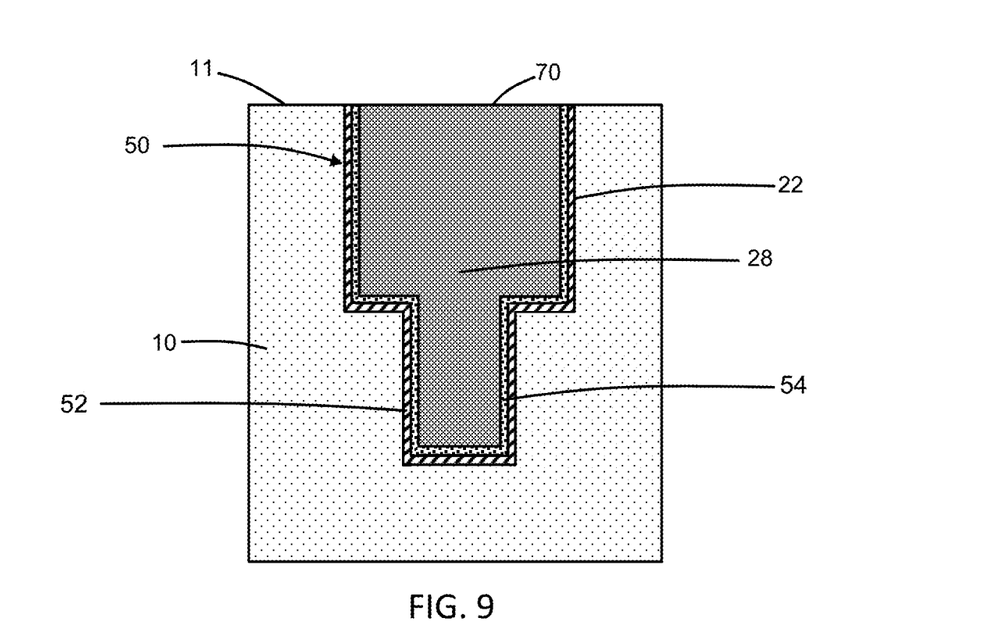
FIGS. 9-10 are cross-sectional views of a structure at successive fabrication stages of a processing method in accordance with alternative embodiments of the invention.

With reference to FIG. 9 in which like reference numerals refer to like features in FIG. 5 and in accordance with embodiments of the invention, the interconnect opening 50 may include the via opening 26 and trench 24 of interconnect opening 18. The conductor layer 28 may be formed inside a lower portion and an upper portion of the interconnect opening 50 such that the interconnect opening 50 is filled or substantially filled with the metal of the conductor layer 28. In the representative embodiment, the conductor layer 28 is formed inside the via opening 26 and the trench 24 of the interconnect opening 50 after the barrier layer 52 and liner layer 54 are formed, and includes a top surface 70 that may be planarized relative to the top surface 11 of the dielectric layer 10. The liner 54 may promote the void-free filling of the interconnect opening 50 by the conductor layer 28.

Figure 10:
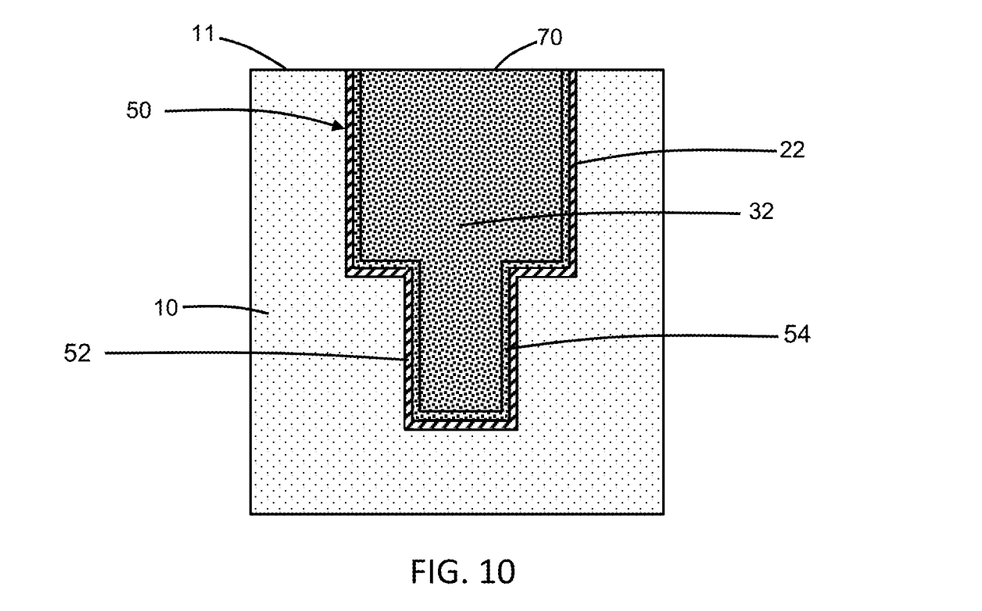

With reference to FIG. 10 in which like reference numerals refer to like features in FIG. 9 and at a subsequent fabrication stage, the conductor layer 28 is displaced and replaced by the displacement reaction to form the conductor layer 32 inside the lower and upper portions of the interconnect opening 50. The conductor layer 32 reproduces the shape and dimensions of the replaced conductor layer 28 and, in the representative embodiment, the conductor layer 32 fills or substantially fills the trench 24 and via opening 26 of the interconnect opening 50 in the space not occupied by the barrier layer 52 and liner layer 54.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane. Terms such as "above" and "below" are used to indicate positioning of elements or structures relative to each other as opposed to relative elevation.

A feature "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
a dielectric layer including an interconnect opening having a first portion and a second portion arranged over the first portion;
a first conductor layer that fills the first portion of the interconnect opening, the first conductor layer comprised of a first metal; and
a second conductor layer inside the second portion of the interconnect opening, the second conductor layer comprised of a second metal,
wherein the first metal is ruthenium, the first conductor layer has a first surface that projects out of the first portion of the interconnect opening and into the second portion of the interconnect opening, and the first surface of the first conductor layer is convexly curved.

2. The structure of claim 1 wherein the first conductor layer is in direct contact with surfaces of the dielectric layer bordering the first portion of the interconnect opening.

3. A structure comprising:
a dielectric layer including an interconnect opening having a first portion and a second portion arranged over the first portion;
a first conductor layer that fills the first portion of the interconnect opening, the first conductor layer comprised of a first metal;
a second conductor layer inside the second portion of the interconnect opening, the second conductor layer comprised of a second metal; and
a metal feature that is intersected by the interconnect opening, the metal feature comprised of a third metal,
wherein the first metal is ruthenium, the first conductor layer includes a first surface that defines a curved interface between the first metal of the first conductor layer and the third metal of the metal feature, and the first surface is arcuate and convex.

4. The structure of claim 3 wherein the first surface has a directly contacting arrangement with the metal feature along the curved interface.

5. The structure of claim 1 further comprising:
a barrier/liner layer arranged between the second conductor layer and the first surface of the first conductor layer,
wherein the first surface of the first conductor layer defines a curved interface between the first metal of the first conductor layer and the barrier/liner layer.

6. The structure of claim 1 wherein the first portion of the interconnect opening is a via opening, the first conductor layer is arranged in the via opening, the second portion of the interconnect opening is a trench arranged over the via opening, the second conductor layer is arranged in the trench, and the second metal is copper or cobalt.

7. The structure of claim 1 wherein the first portion of the interconnect opening has a first end intersecting the second portion of the interconnect opening and a second end, the second end is opposite from the first end, the first surface of the first conductor layer projects out of the first end of the first portion of the interconnect opening, and the surface of the first conductor layer defines a first curved interface between the first metal of the first conductor layer and the second metal of the second conductor layer.

8. The structure of claim 7 further comprising:
a metal feature that is intersected by the second end of the first portion of the interconnect opening, the metal feature comprised of a third metal,
wherein the first conductor layer has a second surface that projects out of the second end of the first portion of the interconnect opening, and the second surface of the first conductor layer defines a second curved interface between the first metal of the first conductor layer and the third metal of the metal feature.

9. A method comprising:
forming an interconnect opening in a dielectric layer;
forming a first conductor layer comprised of a first metal in the interconnect opening;
exposing the first conductor layer to a solution containing ions of a second metal having a standard reduction potential that is greater than a standard reduction potential of the first metal; and
forming a second conductor layer inside the interconnect opening by a displacement reaction in which the ions of the second metal provide atoms of the second metal that displace and replace atoms of the first metal of the first conductor layer,
wherein the second metal is ruthenium.

10. The method of claim 9 wherein the first metal of the first conductor layer is completely replaced by the second metal of the second conductor layer.

11. The method of claim 9 wherein the interconnect opening has a first portion and a second portion arranged over the first portion, the first conductor layer is formed in the first portion of the interconnect opening, and the second conductor layer is formed in the first portion of the interconnect opening by the displacement reaction.

12. The method of claim 11 wherein the second conductor layer is in direct contact with a plurality of surfaces of the dielectric layer bordering the first portion of the interconnect opening.

13. The method of claim 11 wherein a portion of the first conductor layer projects out of the first portion of the interconnect opening and includes a surface that has a dome shape, and the second conductor layer includes a first surface that has a curved shape after the displacement reaction.

14. The method of claim 13 wherein the interconnect opening opens onto a metal feature comprised of a third metal, and further comprising:
extending the displacement reaction to displace the third metal of a portion of the metal feature adjacent to the interconnect opening and replace the third metal with the second metal to extend the second conductor layer into the metal feature by the displacement reaction.

15. The method of claim 14 wherein, after extending the displacement reaction, the second conductor layer includes a second surface defining an interface between the second conductor layer and the metal feature, and the second surface has a curved shape.

16. The method of claim 11 wherein the first portion of the interconnect opening is a via opening, the second conductor layer is arranged in the via opening, the interconnect opening further includes a trench arranged in the dielectric layer over the via opening, and further comprising:
 depositing a conductor inside the trench and over the second conductor layer.

17. The method of claim 11 further comprising:
 after forming the second conductor layer, depositing a barrier/liner layer on surfaces of the dielectric layer and a surface of the second conductor layer bordering the second portion of the interconnect opening; and
 after depositing the barrier/liner layer, depositing a third conductor layer inside the second portion of the interconnect opening,
 wherein the third conductor layer is comprised of copper or cobalt.

18. The method of claim 11 wherein the first portion of the interconnect opening is a via opening having a first end and a second end opposite from the first end, the second portion of the interconnect opening is a trench that is intersected by the first end of the via opening, the first conductor layer has a first surface that projects out of the first end of the via opening and a second surface that projects out of the second end of the via opening, and the first surface and the second surface of the first conductor layer each have a curved shape.

19. The method of claim 9 further comprising:
 before forming the first conductor layer, depositing a barrier layer on a plurality of surfaces of the dielectric layer bordering the interconnect opening; and
 before forming the first conductor layer, depositing a liner layer on the barrier layer,
 wherein the liner layer is comprised of ruthenium.

20. The structure of claim 3 wherein the first conductor layer has a second surface that projects out of the first portion of the interconnect opening and into the second portion of the interconnect opening, and the second surface of the first conductor layer is convexly curved.

* * * * *